US007663153B2

(12) United States Patent
Huang et al.

(10) Patent No.: US 7,663,153 B2
(45) Date of Patent: Feb. 16, 2010

(54) LIGHT EMITTING DIODE WITH EMBEDDED SAW-TOOTH MULTILAYER HAVING A PHOTONIC CRYSTAL STRUCTURE AND PROCESS FOR FABRICATING THE SAME

(75) Inventors: Chen-Yang Huang, Jhubei (TW); Hao-Min Ku, Taipei (TW); Shiuh Chao, Hsinchu (TW); Chu-Li Chao, Hsinchu (TW); Rong Xuan, Yonghe (TW)

(73) Assignees: Industrial Technology Research Institute, Hsinchu (TW); National Tsing Hua University, Hsinchu (TW)

( * ) Notice: Subject to any disclaimer, the term of this patent is extended or adjusted under 35 U.S.C. 154(b) by 41 days.

(21) Appl. No.: 12/011,304

(22) Filed: Jan. 25, 2008

(65) Prior Publication Data
US 2009/0114935 A1     May 7, 2009

(30) Foreign Application Priority Data
Nov. 7, 2007   (TW) ............................. 96142064 A

(51) Int. Cl.
*H01L 31/00* (2006.01)
(52) U.S. Cl. .............................. 257/98; 257/13; 257/99; 257/E33.068; 257/E51.021; 438/27; 438/29
(58) Field of Classification Search .................. 257/98, 257/13, 79–103, 918, E33.068, E33.069, 257/E51.021; 438/22, 25–27, 29
See application file for complete search history.

(56) References Cited
U.S. PATENT DOCUMENTS
6,091,085 A    7/2000  Lester

| 6,563,141 | B1 * | 5/2003  | Dawson et al. ................. 257/98 |
| 6,977,774 | B1   | 12/2005 | Kawakami et al. |
| 7,136,217 | B2 * | 11/2006 | Kawakami et al. .......... 359/321 |
| 2003/0057444 | A1 | 3/2003 | Niki et al. |
| 2005/0133796 | A1 * | 6/2005 | Seo et al. ....................... 257/79 |
| 2007/0221929 | A1 | 9/2007 | Lee et al. ...................... 257/79 |

FOREIGN PATENT DOCUMENTS
CN          1874012 A        12/2006

OTHER PUBLICATIONS

Chinese First Examination Report of China Application No. 2007101886664, dated Sep. 25, 2009.

* cited by examiner

*Primary Examiner*—Evan Pert
*Assistant Examiner*—Scott R Wilson
(74) *Attorney, Agent, or Firm*—J.C. Patents

(57) ABSTRACT

A light emitting diode (LED) is provided. The LED at least includes a substrate, a saw-toothed multilayer, a first type semiconductor layer, an active emitting layer and a second type semiconductor layer. In the LED, the saw-tooth multilayer is formed opposite the active emitting layer below the first type semiconductor layer by an auto-cloning photonic crystal process. Due to the presence of the saw-tooth multilayer on the substrate of the LED, the scattered light form a back of the active emitting layer can be reused by reflecting and recycling through the saw-tooth multilayer. Thus, all light is focused to radiate forward so as to improve the light extraction efficiency of the LED. Moreover, the saw-tooth multilayer does not peel off or be cracked after any high temperature process because the saw-tooth multilayer has the performance of releasing thermal stress and reducing elastic deformation between it and the substrate.

19 Claims, 13 Drawing Sheets

LIGHT EMITTING DIODE WITH
EMBEDDED SAW-TOOTH MULTILAYER
HAVING A PHOTONIC CRYSTAL
STRUCTURE AND PROCESS FOR
FABRICATING THE SAME

CROSS-REFERENCE TO RELATED
APPLICATION

This application claims the priority benefit of Taiwan application serial no. 96142064, filed Nov. 7, 2007. The entirety of each of the above-mentioned patent application is incorporated herein by reference and made a part of this specification.

BACKGROUND OF THE INVENTION

1. Field of the Invention

The present invention relates to a light emitting diode (LED) capable of enhancing light extraction efficiency and a process for fabricating the same.

2. Description of Related Art

A light emitting diode (LED) is a semiconductor device constituted mainly by group III-V compound semiconductor materials, for example. Since such semiconductor materials have a characteristic of converting electricity into light, when a current is applied to the semiconductor materials, electrons therein would be combined with holes and release excessive energy in a form of light, thereby achieving an effect of luminosity.

FIG. 1A is a schematic cross-sectional view of a conventional LED. Referring to FIG. 1A, a conventional LED 10 is generally constituted by a substrate 100, an n-type semiconductor layer 102 thereon, an active emitting layer 104, and a p-type semiconductor layer 106. Moreover, there is an n-type electrode 108 on a surface of the n-type semiconductor layer 102, and there is a p-type electrode 110 on a surface of the p-type semiconductor layer 106.

However, as to the conventional GaN LED, sapphire is used as an epitaxy substrate generally. Since sapphire is a transparent material, an LED fabricated by using sapphire would scatter light to all directions without focusing the light and thus cause consumption, as illustrated by arrows pointing below the substrate 100 from the active emitting layer 104 in FIG. 1A. Meanwhile, the scattered light would be absorbed by each semiconductor layer inside the LED and reserved in a form of heat. Therefore, emitting luminosity and efficiency of the GaN LED is lowered.

In order to enhance the luminosity efficiency of the LED, in a method recently disclosed by U.S. Pat. No. 6,091,085 or US 2003/057444 A1, an epitaxy sapphire substrate is fabricated as a periodic structure so as to reduce epitaxy defects in GaN and enhance its luminosity. Simultaneously, a one-dimensional periodic light grid structure may allow a portion of back light to be refracted so as to emit forward and be reused and thereby increasing an light extraction efficiency of the LED as a whole.

Nevertheless, the light grid structure does not refract vertical incident light well. Only an incident light with a larger incident angle may have an obvious reflection effect. Hence, the light grid structure achieves only limited results in recycling and reusing vertically-emitted light.

Recently, in U.S. Pat. No. 6,563,141, a distributed Bragg reflector (DBR) mirror has been disclosed, wherein the mirror is a planar multi-layer dielectric having alternate layers of dielectric material with a high refractive index ratio between the adjacent layers and a reflectivity of the order of 97% or more.

However, high temperature form epitaxial process will cause the following two phenomena. One is the break of the DBR mirror caused by thermal stress deformation because the DBR mirror and the substrate have different coefficient of thermal expansion; the other is the peeling between the DBR mirror and the substrate caused by the elastic deformation resulted from high temperature process. Therefore, the DBR mirror disclosed in U.S. Pat. No. 6,563,141 may peel off and be cracked after high temperature epitaxial process, and thus it is difficult to be commercialized, as shown in FIG. 1B. FIG. 1B is a scanning electron microscope (SEM) photograph of a top view of the planar multi-layer dielectric after annealing at 1100° C.

SUMMARY OF THE INVENTION

The present invention is directed to providing an LED which significantly reduces a reflection effect of forward vertical light such that a reflectivity of a back of the LED is enhanced and the said light is reused as a forward-emitting light.

The present invention is directed to further providing a process for fabricating an LED and the process enhances luminescent efficiency of the LED as a whole.

The present invention is directed to providing another process for fabricating an LED with fewer steps to enhance the luminescent efficiency of the LED as a whole.

The present invention provides an LED at least including a substrate, a first type semiconductor layer, an active emitting layer, a second type semiconductor layer and a saw-toothed multilayer. The first type semiconductor layer is disposed on the substrate; the active emitting layer is disposed on the first type semiconductor layer, and the second type semiconductor layer is disposed on the active emitting layer. The saw-toothed multilayer is disposed below the first type semiconductor layer and opposite the active emitting layer.

The present invention further provides a process for fabricating an LED. The process includes fabricating a saw-toothed multilayer on a substrate by an auto-cloning photonic crystal process. Next, the saw-toothed multilayer is patterned to form a lattice structure. Afterwards, a first type semiconductor layer is formed on the substrate to cover the lattice structure, and then an active emitting layer is formed on the first type semiconductor layer. Thereafter, a second type semiconductor layer is formed on the active emitting layer.

The present invention further provides a process for fabricating an LED. The process includes a) forming a first type semiconductor layer on a substrate; b) forming an active emitting layer on the first type semiconductor layer; c) forming a second type semiconductor layer on the active emitting layer. Moreover, a saw-toothed multilayer is optionally formed before the step a) or after the step c) by an auto-cloning photonic crystal process.

In the present invention, since the saw-toothed multilayer is added to the LED, an effect of an omnidirectional reflector is achieved through a bandgap of a photonic crystal structure in the saw-toothed multilayer. Thus, light emitted from a back of the LED, no matter in which incident angle the light enters the structure, can all be omnidirectional reflected. Meanwhile, a periodic light grid changes a refraction direction of the light and focuses the light to emit forward and thereby enhancing the luminescent efficiency of the LED as a whole.

In order to make the aforementioned and other objects, features and advantages of the present invention more comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
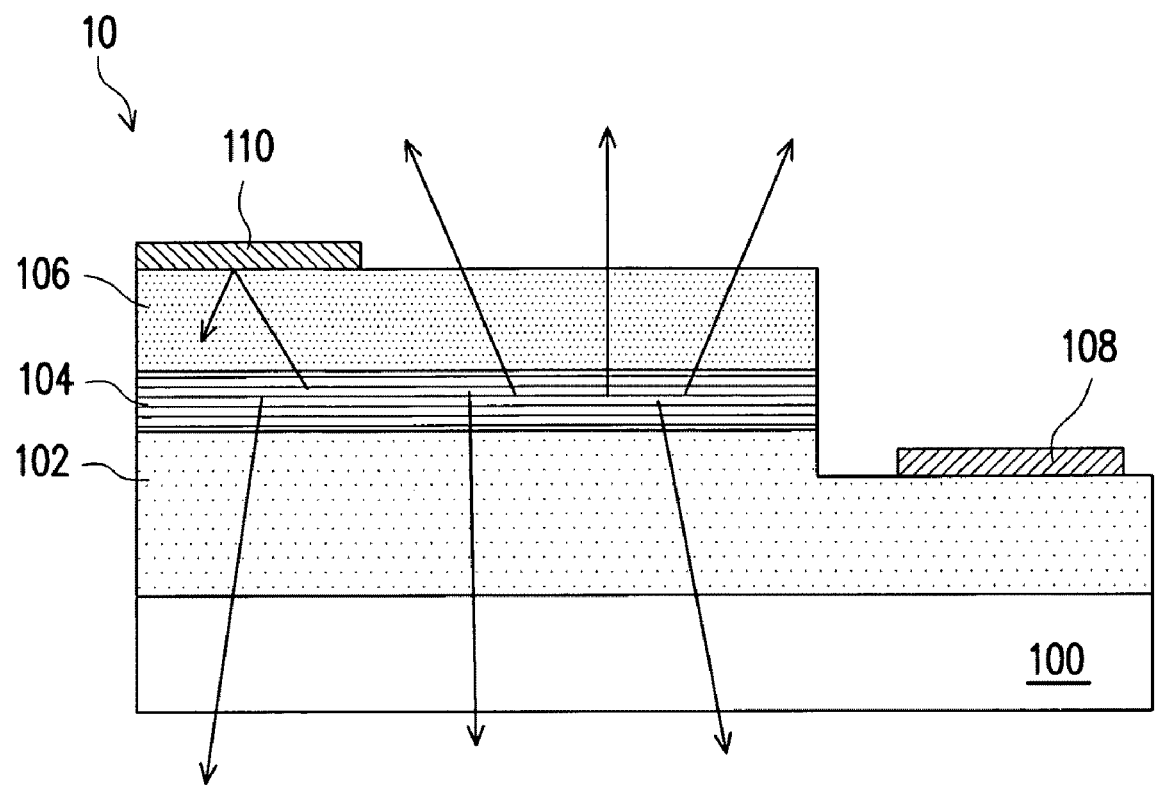
FIG. 1A is a schematic cross-sectional view of a conventional light emitting diode (LED).
Figure 1B:
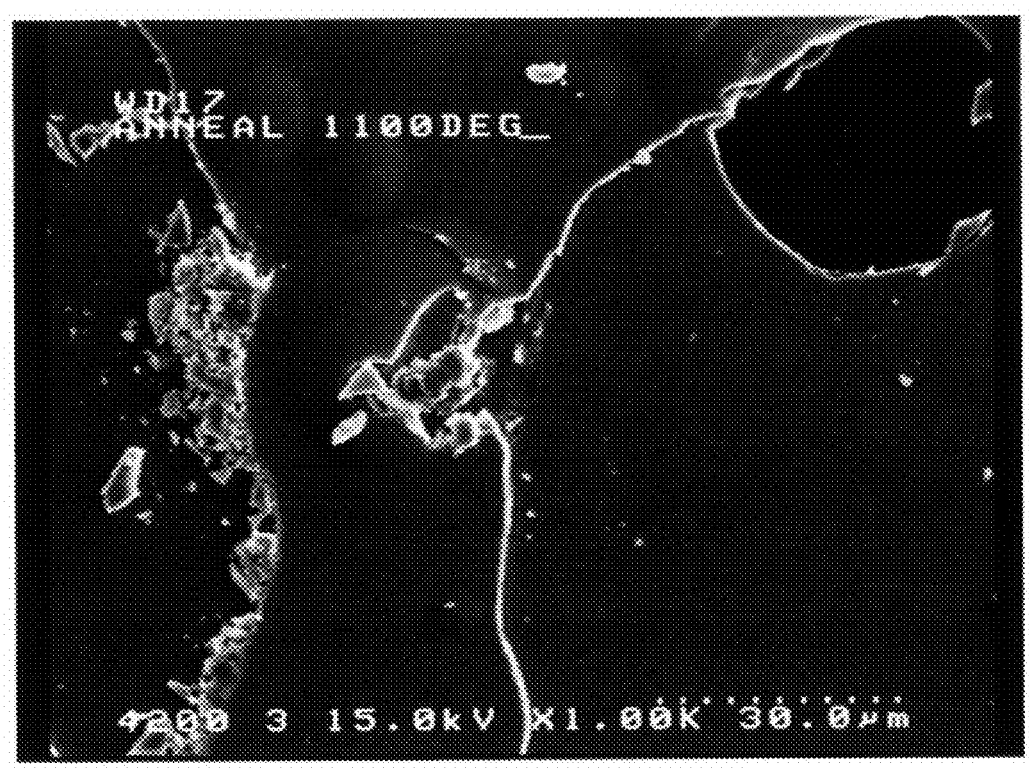
FIG. 1B is a SEM photograph of a top view of the planar multi-layer dielectric after annealing at 1100° C.

A description accompanied with drawings is provided in the following to sufficiently explain embodiments of the present invention. However, it is noted that the present invention may still be implemented in many other different forms and should not be construed as limited to the embodiments described hereinafter. In actuality, the embodiments are provided to render disclosure of the present invention more explicit and complete so as to fully convey the scope of the present invention to people ordinarily skilled in the art. In the drawings, for the purpose of clarity and specificity, the sizes and the relative sizes of each layer and region may not be illustrated in accurate proportion.

Figure 2:
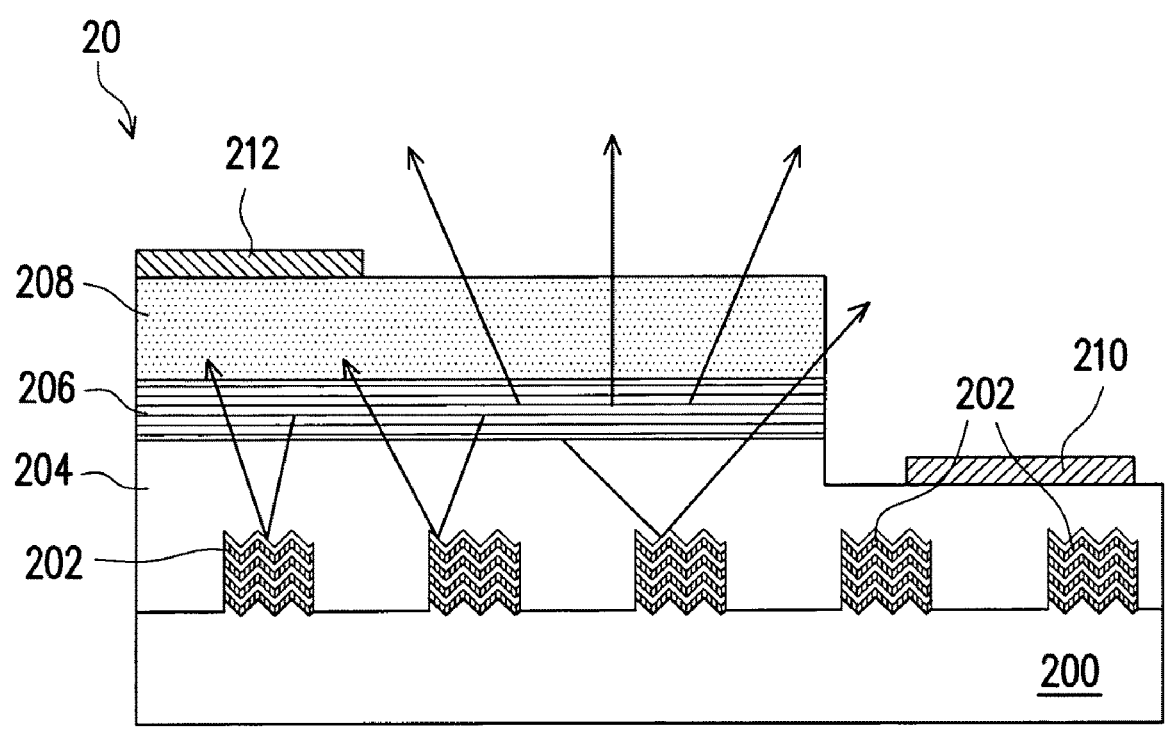
FIG. 2 is a schematic cross-sectional view of the LED according to the first embodiment of the present invention.

FIG. 2 is a schematic cross-sectional view of the LED according to the first embodiment of the present invention.

Referring to FIG. 2, an LED 20 of the first embodiment at least includes a substrate 200, a saw-toothed multilayer 202, a first type semiconductor layer 204 on the substrate 200, an active emitting layer 206 and a second type semiconductor layer 208. The first type semiconductor layer 204 is disposed on the substrate 200; the active emitting layer 206 is disposed on the first type semiconductor layer 204, and the second type semiconductor layer 208 is disposed on the active emitting layer 206. The saw-toothed multilayer 202 is disposed below the first type semiconductor layer 204 and opposite the active emitting layer 206. According to the first embodiment, the saw-toothed multilayer 202 is disposed between the substrate 200 and the first type semiconductor layer 204. Moreover, the saw-toothed multilayer 202 has a lattice structure and the lattice structure has a photonic crystal structure therein. A detailed description in the following will elaborate on the structure.

Referring to FIG. 2, a material of the substrate 200 is sapphire, SiC, Si, GaAs, $LiAlO_2$, $LiGaO_2$ or AlN, for example. The first embodiment is exemplified by the substrate 200 made of sapphire. In addition, on a surface of the first type semiconductor layer 204 is generally disposed a first type electrode 210, and on a surface of the second type semiconductor layer 208 is generally disposed a second type electrode 212. Furthermore, the first type semiconductor layer 204 may be an n-type semiconductor layer, and the second type semiconductor layer 208 may be a p-type semiconductor layer. Therefore, the first type electrode 210 is an n-type electrode, and the second type electrode 212 is a p-type electrode.

The saw-toothed multilayer 202 in the first embodiment is periodically stacked on the substrate 200. The saw-toothed multilayer 202 is formed by alternately stacking layers of high and low reflectivity materials with two or more than two materials having different reflectivities, such as an auto-cloning photonic crystal. For example, stacked thin layers in the saw-toothed multilayer 202 are fabricated by using two materials selected from a group consisting of $TiO_2$, $Ta_2O_5$, $Nb_2O_5$, $CeO_2$, ZnS, ZnO, GaN, $SiN_x$, AlN, $Al_2O_3$, $SiO_2$ and $MgF_2$.

Figure 3C:
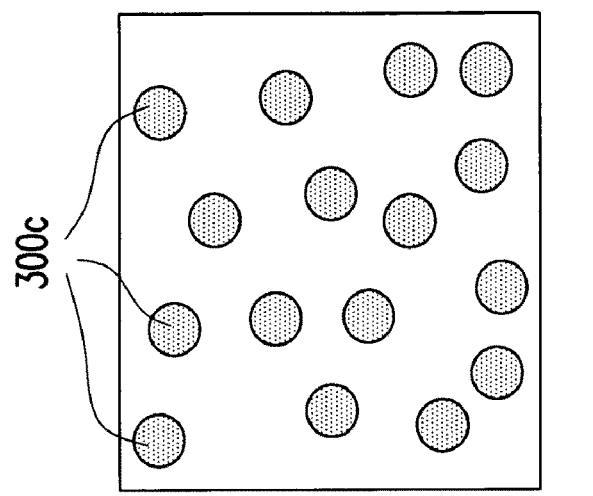
FIGS. 3A through 3C are top views of arrangements of the saw-toothed multilayer in FIG. 2.
Figure 3B:
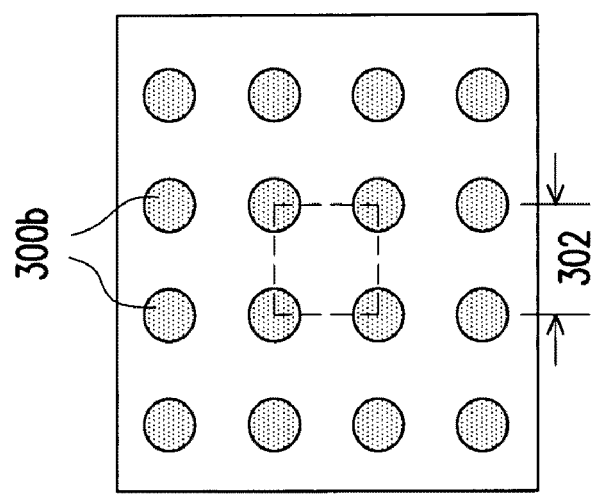
Figure 3A:
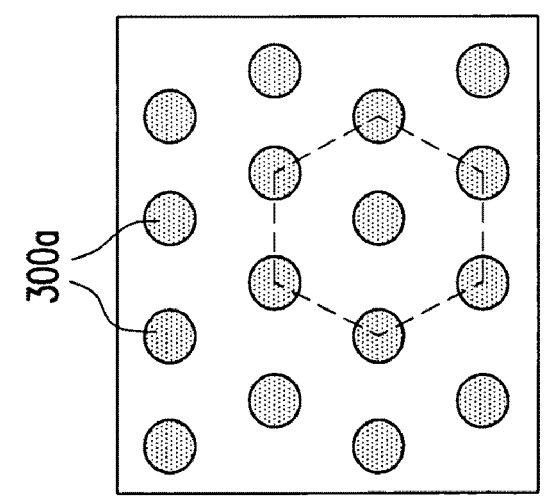

Additionally, the saw-toothed multilayer 202 of the first embodiment has a lattice structure including a one-dimensional, two-dimensional or three-dimensional structure. The lattice structure may be arranged in a triangular array, a hexagonal array 300a (as illustrated in FIG. 3A), a square 300b (as illustrated in FIG. 3B) or a combination array 300c (as illustrated in FIG. 3C). An outward shape of the lattice structure may also be a rectangle, strip or triangle besides the half circle shape illustrated in FIGS. 3A through 3C. In the first embodiment, a period and/or a height of the lattice structure is determined by a luminescent wavelength range of the lattice structure suitable for the LED. Taking a blue light of 450 nm as an example, a period 302 of the lattice structure as illustrated in FIG. 3B is about 1-20 μm.

Figure 4A:
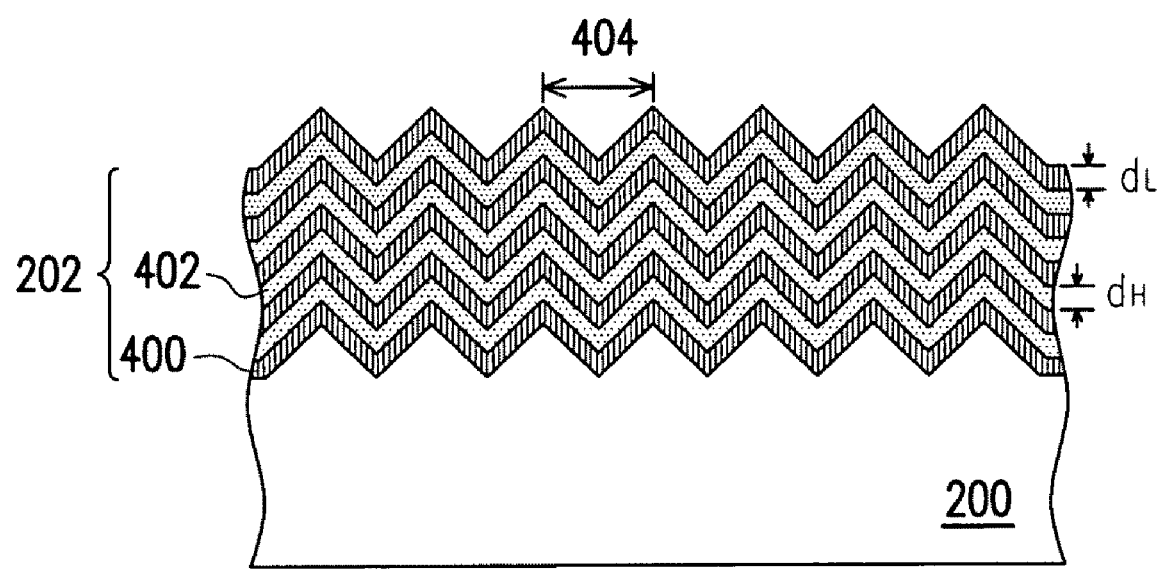
FIG. 4A is an enlarged view of the saw-toothed multilayer in FIG. 2.
Figure 4B:
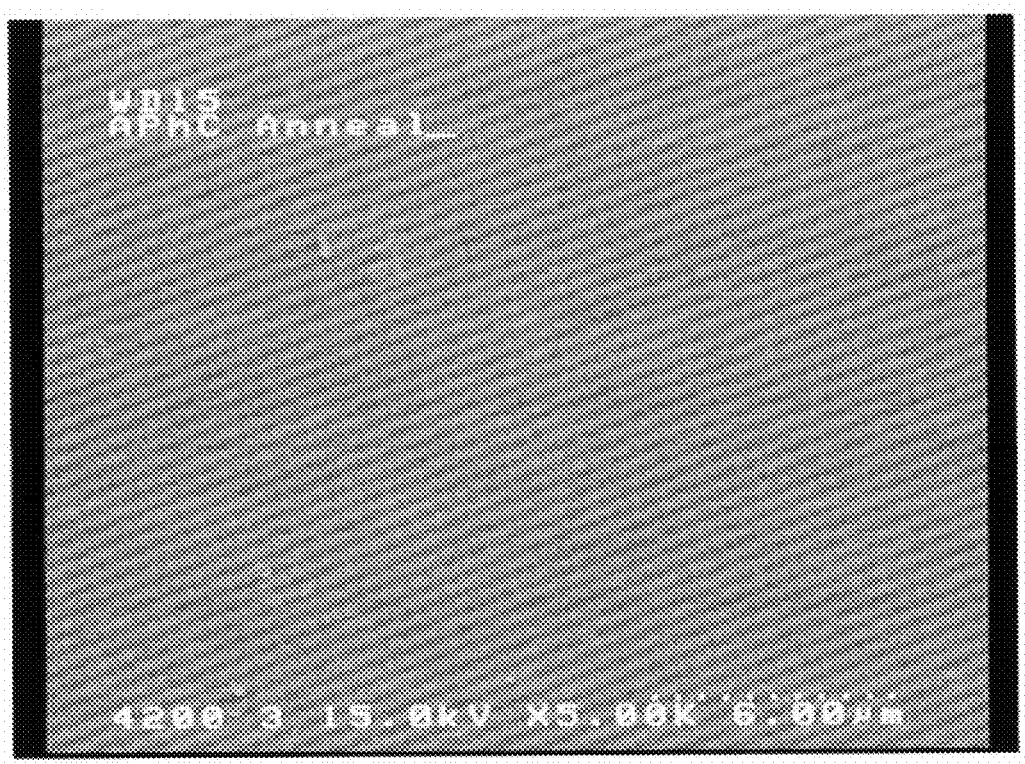
FIG. 4B is a SEM photograph of a top view of the saw-toothed multilayer in FIG. 4A after annealing at 1100° C.

Besides determining the luminescent wavelength range of the lattice structure suitable for the LED by such macro parameters as the period and/or height of the lattice structure, at least one of following conditions also needs to be coordinated in the first embodiment to properly control characteristics of light reflection, for example, a period of the saw-toothed multilayer 202, a thickness of the stacked thin layers, a layer number of the stacked thin layers and refractive indexes of the materials of the stacked thin layers. Taking the blue light LED of 450 nm as an example, FIG. 4A illustrates an enlarged view of the saw-toothed multilayer 202 in the first embodiment; FIG. 4B is a SEM photograph of a top view of the saw-toothed multilayer in FIG. 4A after annealing at 1100° C. In FIG. 4A, the saw-toothed multilayer 202 covers the substrate 200 having an initial outward shape of a triangular cone. In FIG. 4B, the saw-toothed multilayer in the first embodiment of the present invention it does not peel off or be cracked after high temperature epitaxial process, since the saw-toothed multilayer has the performance of releasing thermal stress and reducing elastic deformation between the saw-toothed multilayer (refer to 202 in FIG. 4A) and the substrate (refer to 200 in FIG. 4A).

Figure 5A:
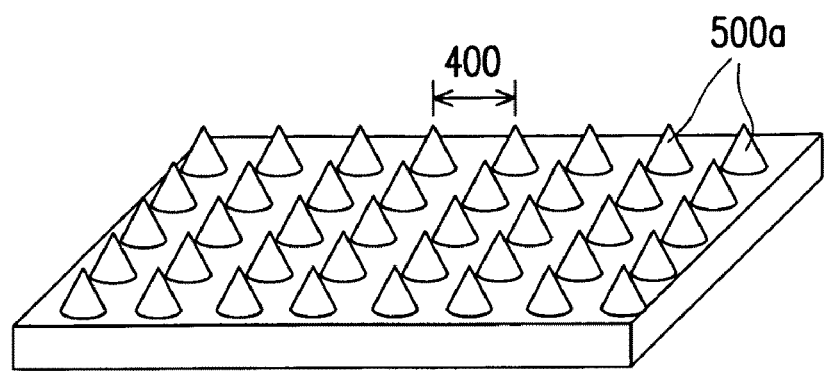
FIG. 5A is a schematic three-dimensional view of an outward shape of the substrate in FIG. 4A.

Moreover, a three-dimensional view of the substrate 200 having an initial outward shape of a triangular cone in FIG. 4A is illustrated as triangular cones 500a in FIG. 5A. In FIGS. 4A and 5A, a first stacked thin layer 400 and a second stacked thin layer 402 disposed on the sapphire substrate 200 are fabricated by a low-reflectivity material and a high-reflectivity material respectively. A refractive index $n_L$ of the first stacked thin layer 400 is about 1.3-2.5 with a thickness $d_L$ thereof about 50-200 nm. A refractive index $n_H$ of the second stacked thin layer 402 is about 1.5-4 with a thickness $d_H$ thereof about 50-200 nm. A period 404 of the saw-toothed multilayer 202 is about 200-1000 nm. A photonic crystal bandgap obtained from the aforementioned design would fall within a luminescent wavelength range of the LED. Hence, an omnidirectional reflector is formed by the saw-toothed multilayer 202 and any light entering the LED can be completely reflected.

Figure 5B:
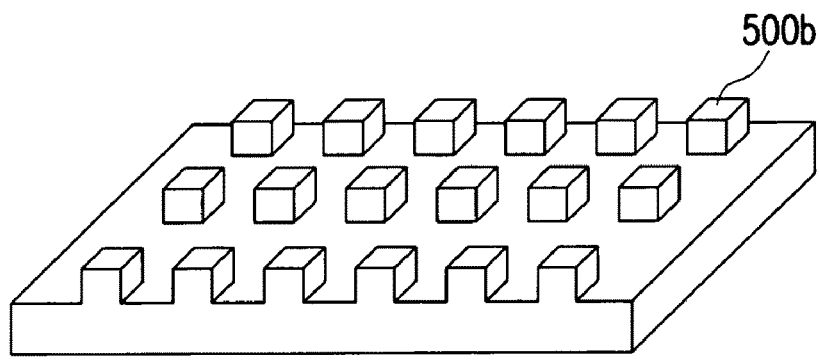
FIGS. 5B to 5F are schematic views illustrating deformations of the outward shape of the substrate in FIG. 4A.
Figure 5C:
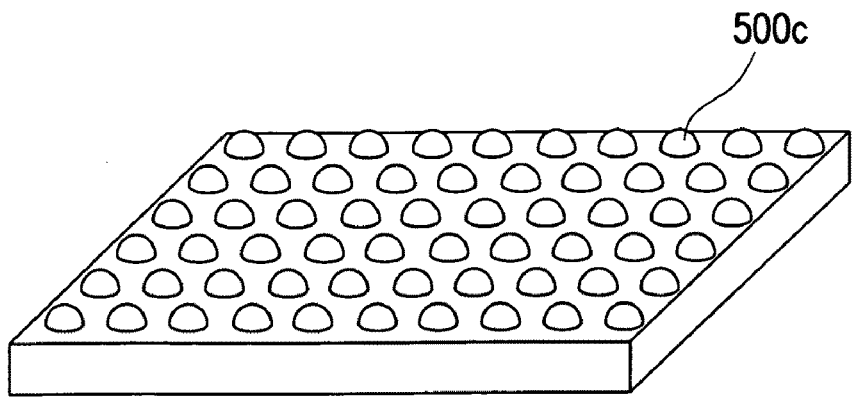
Figure 5D:
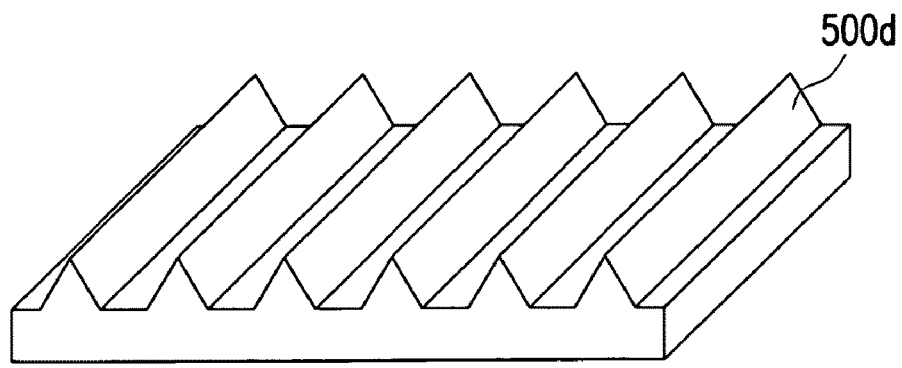
Figure 5E:
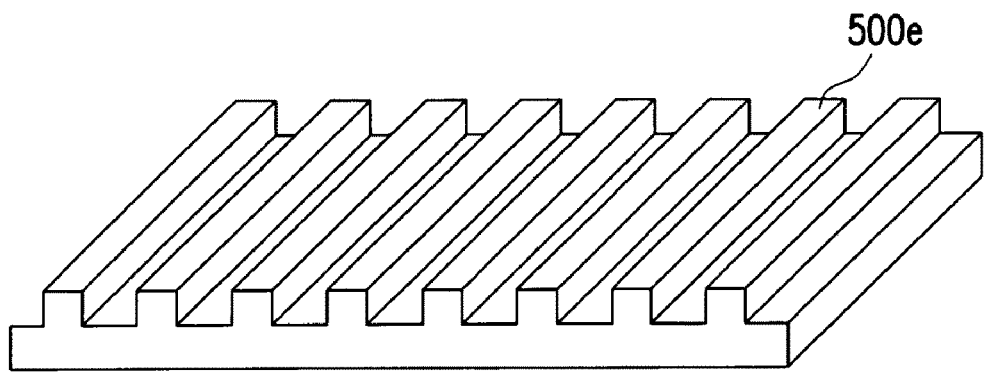
Figure 5F:
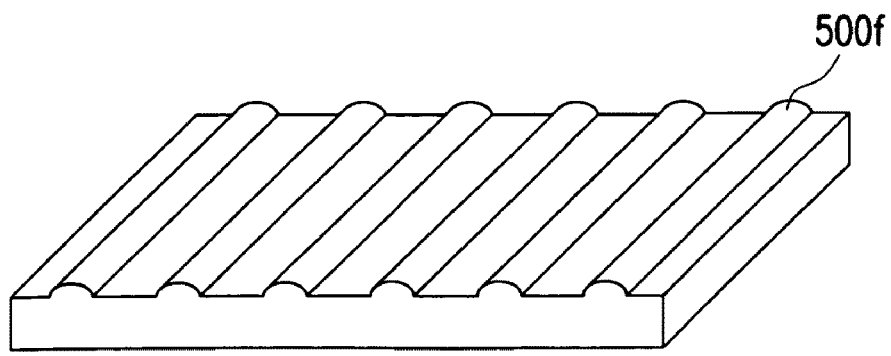

Besides the triangular cones 500a as illustrated in FIG. 5A, the initial outward shape of the substrate may also be cubes 500b (as illustrated in FIG. 5B) or half circles 500c (as illustrated in FIG. 5C). Furthermore, the initial outward shape of the substrate may also be a strip 500d with a cross-sectional view thereof as a triangle (as illustrated in FIG. 5D), a strip 500e with a cross-sectional view thereof as a square or rectangle (as illustrated in FIG. 5E) or a strip 500f with a cross-sectional view thereof as a half circle (as illustrated in FIG. 5F).

Figure 6:
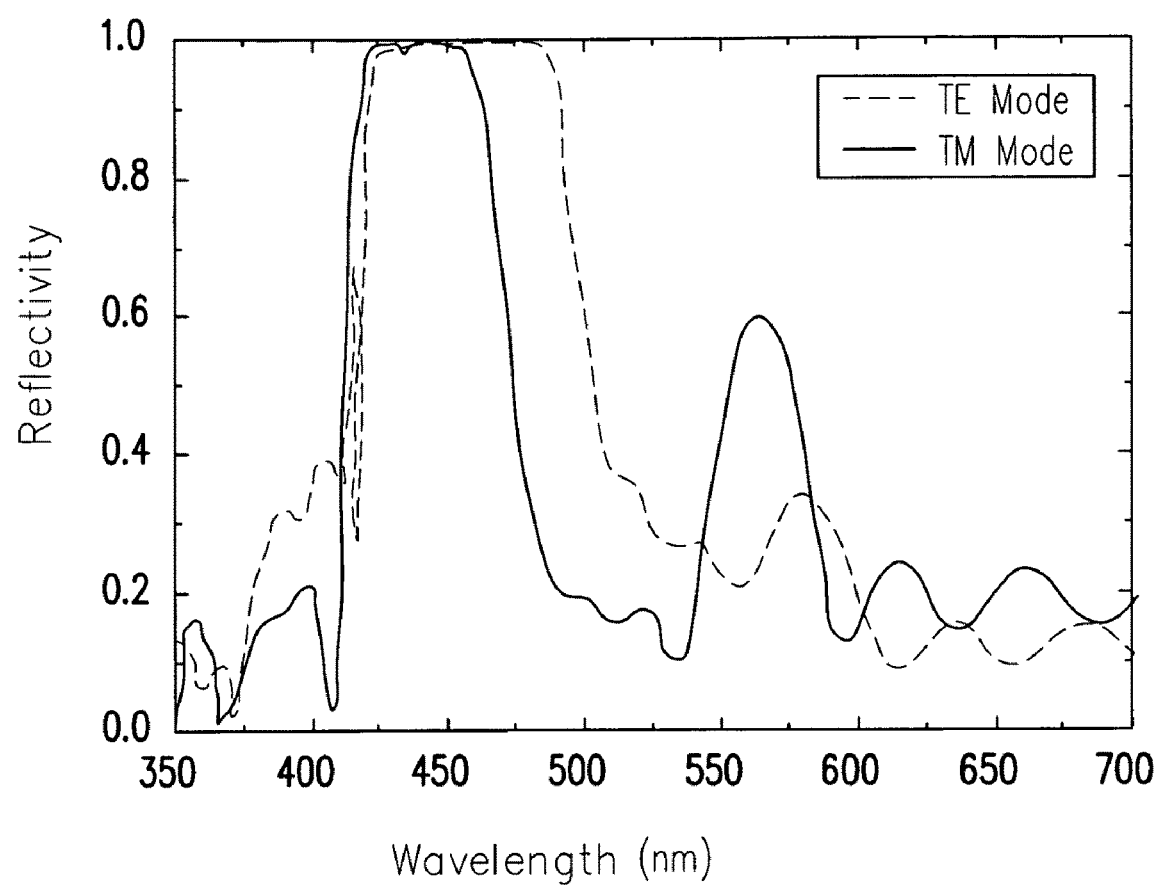
FIG. 6 is a diagram illustrating a relationship between wavelength and reflectivity of the auto-cloning photonic crystal in FIG. 4A.

FIG. 6 is a diagram illustrating a relationship between wavelength and reflectivity of the auto-cloning photonic crystal in FIG. 4A. It is known from FIG. 6 that either in a TE mode or a TM mode within a range of 420-470 nm, a back light of a blue light LED can be completely reflected and reused with a reflectivity of 99%. Simultaneously, a periodic lattice light grid structure can change a refraction direction of light. The light would not radiate towards the back of the LED so that luminescent efficiency of the LED is enhanced.

Figure 7:
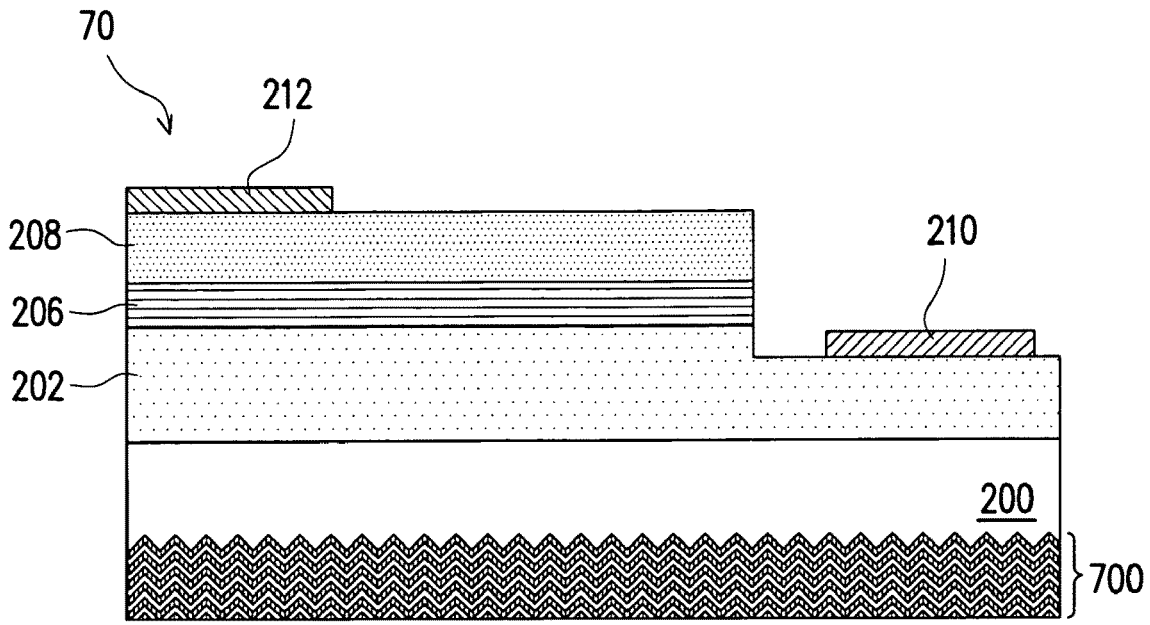
FIG. 7 is a schematic cross-sectional view of the LED according to the second embodiment of the present invention.

FIG. 7 is a schematic cross-sectional view of the LED according to the second embodiment of the present invention. Elements of the present (second) embodiment identical to those in the first embodiment are represented with similar or the same reference numerals.

Referring to FIG. 7, an LED 70 of the second embodiment, identical to the LED 20 of the first embodiment, includes a substrate 200, a first type semiconductor layer 204 thereon, an active emitting layer 206 and a second type semiconductor layer 208. The difference between the LEDs 20 and 70 lies in that a saw-toothed multilayer 700 of the second embodiment is disposed below the substrate 200 as a whole. For a detailed structure and a design concept of the saw-toothed multilayer 700, please refer to the foregoing description of the first embodiment.

Figure 8:
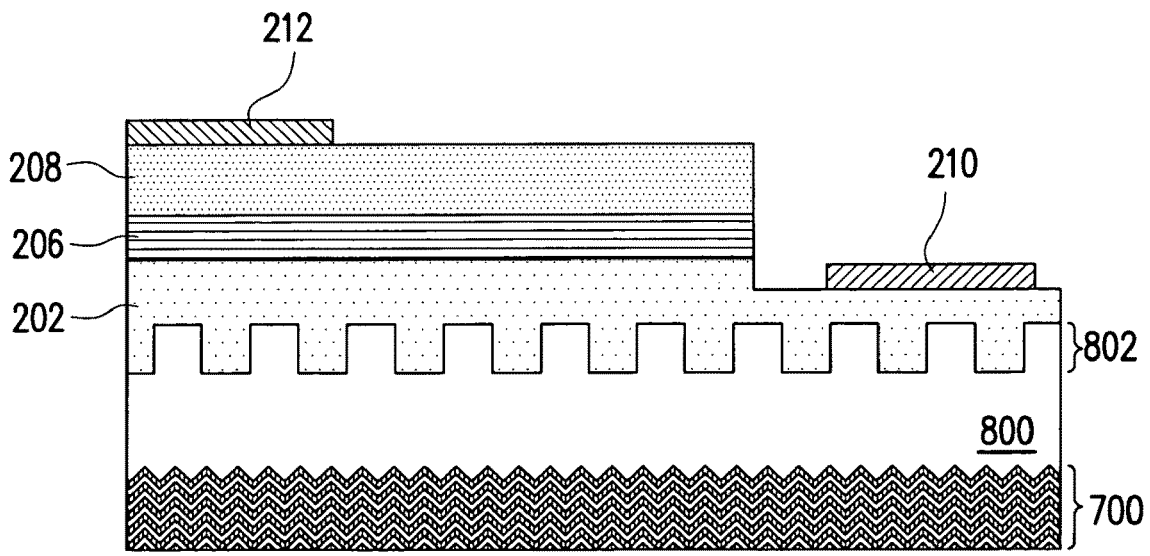
FIG. 8 is a schematic diagram illustrating deformation of the LED in FIG. 7.

Additionally, the LED of the second embodiment may also have other deformations. As illustrated in FIG. 8, a patterned substrate 800 is adopted in the second embodiment, and an outward shape of the patterned substrate 800 may be a patterned sapphire substrate. An outward shape 802 of the patterned substrate 800 may be a strip, a rectangle, a triangle and a half circle. The saw-toothed multilayer 700 is disposed on the other surface of the substrate 800 without the outward shape 802.

FIGS. 9A through 9E are schematic cross-sectional views illustrating the process flow of the LED according to the third embodiment of the present invention.

Figure 9A:
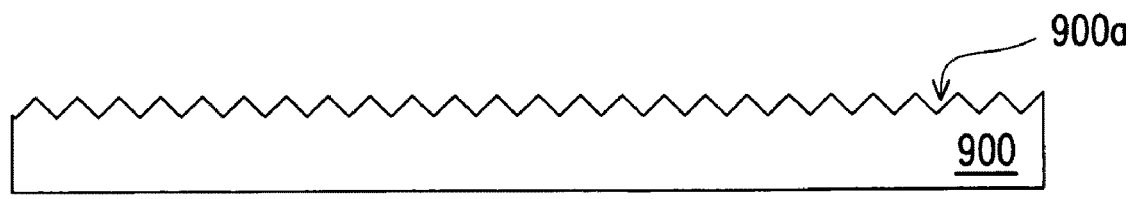
FIGS. 9A through 9E are schematic cross-sectional views illustrating the process flow of the LED according to the third embodiment of the present invention.

Referring to FIG. 9A, a substrate 900 is provided first. A material of the substrate 900 is sapphire, SiC, Si, GaAs, $LiAlO_2$, $LiGaO_2$ or AlN, for example. Further, a triangular infrastructure 900a is fabricated on the substrate 900 by a lithographic process first. A period of the triangular infrastructure 900a is determined according to a luminescent wavelength of the LED. For example, a triangular infrastructure of a 450 nm blue light LED has a period of about 240 nm.

Figure 9B:
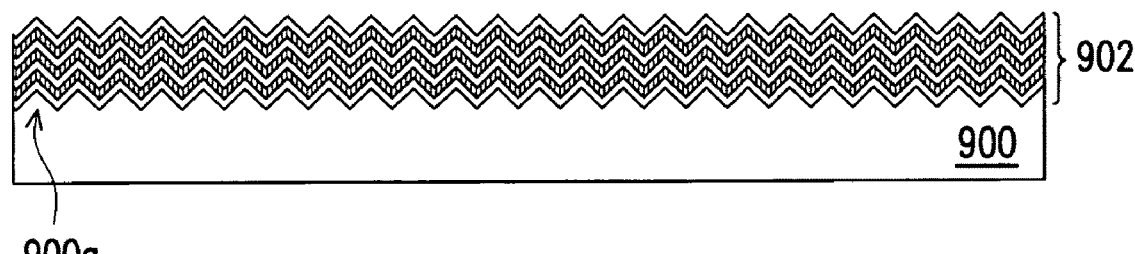

Next, referring to FIG. 9B, a saw-toothed multilayer 902 is fabricated on the substrate 900 by an auto-cloning photonic crystal process. For example, an ion beam sputtering process and an RF bias etching process are performed to sputter high-reflectivity and low-reflectivity materials and control a speed of deposition of stacked thin layers and a speed of a bias etching process alternately so that the outward shape of the stacked thin layers are modified and buckles are formed in the saw-toothed multilayer on the sapphire substrate 900 having the triangular infrastructure 900a. The stacked thin layers in the saw-toothed multilayer 902 are fabricated by using two materials selected from a group consisting of $TiO_2$, $Ta_2O_5$, $Nb_2O_5$, $CeO_2$, ZnS, ZnO, GaN, $SiN_x$, AlN, $Al_2O_3$, $SiO_2$ and $MgF_2$.

Figure 9C:
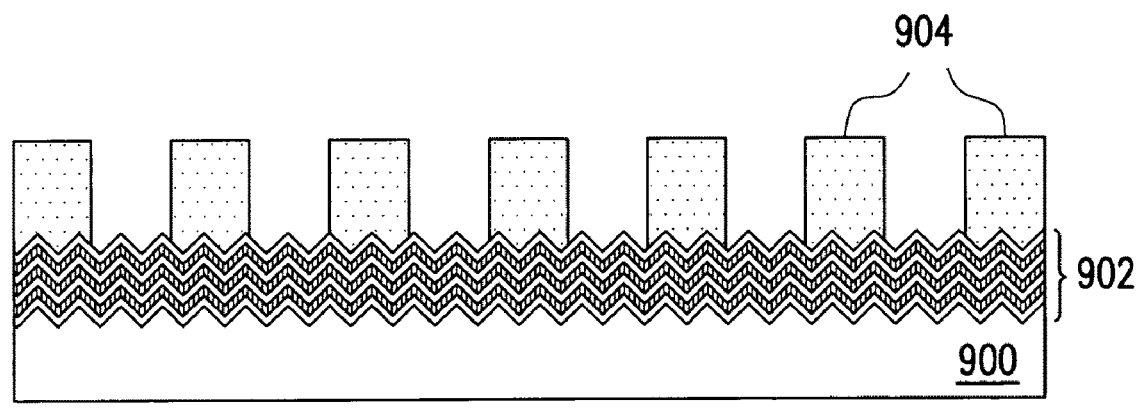

Then, referring to FIG. 9C, a lithographic process is performed to fabricate a lattice pattern 904 on a surface of the saw-toothed multilayer 902.

Figure 9D:
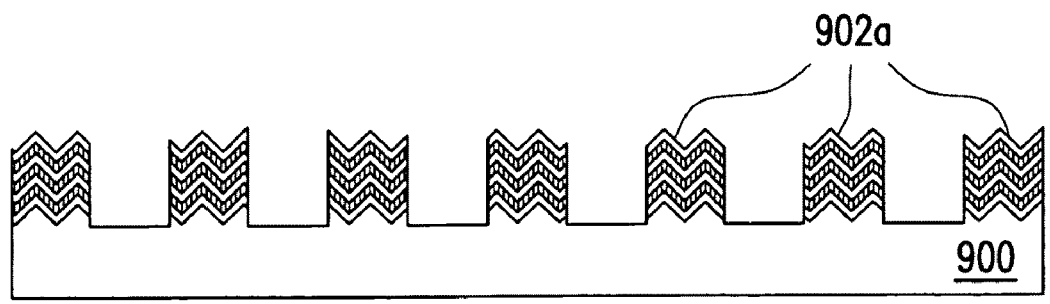

Afterwards, referring to FIG. 9D, a dry etching process or a wet etching process is performed to complete a lattice structure 902a, and the lattice structure 902a may be a structure constituted by strips, circles, rectangles or triangles.

Figure 9E:
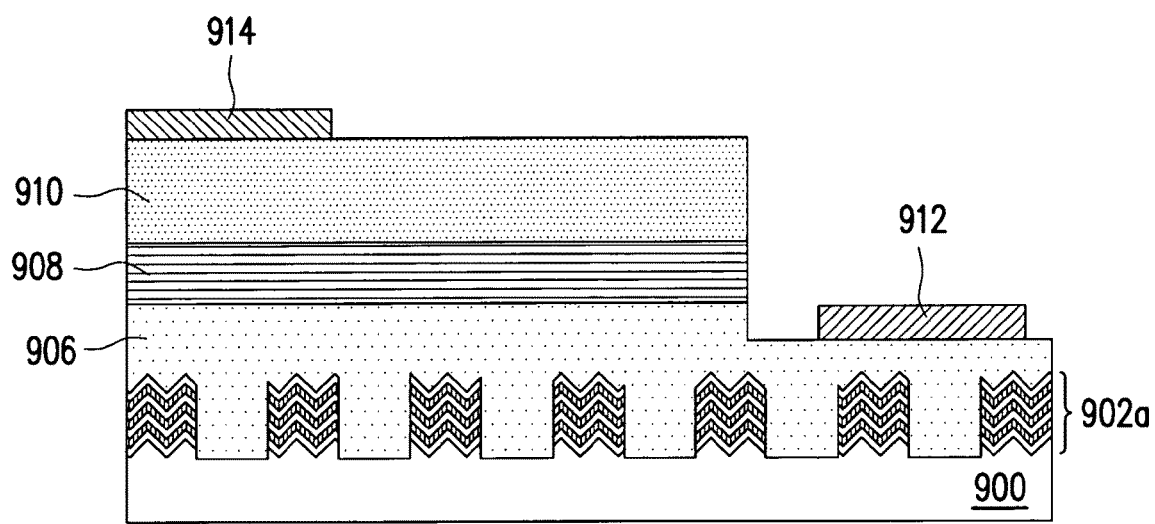

Finally, referring to FIG. 9E, upon completion of the lattice structure 902a, a first type semiconductor layer 906 is formed on the substrate 900 to cover the lattice structure 902a, and then an active emitting layer 908 and a second type semiconductor layer 910 are formed on the first type semiconductor layer 906 in sequence. Thereafter, a first type electrode 912 and a second type electrode 914 may be formed on a surface of the first type semiconductor layer 906 and a surface of the second type semiconductor layer 910 respectively.

Figure 10:
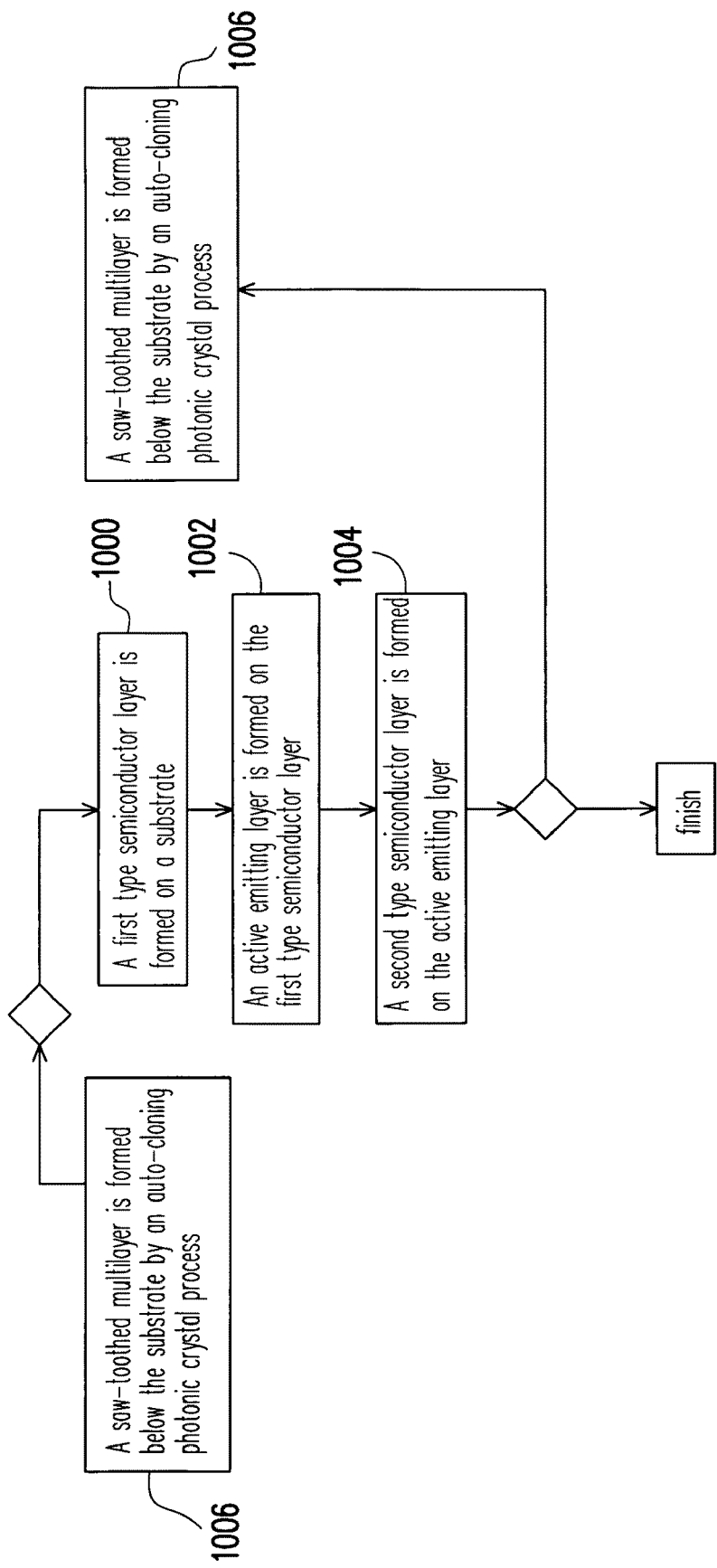
FIG. 10 illustrates a process flow of the LED according to the fourth embodiment of the present invention.

FIG. 10 illustrates a process flow of the LED according to the fourth embodiment of the present invention.

Referring to FIG. 10, in a step 1000, a first type semiconductor layer is formed on a substrate. A material of the substrate is sapphire, SiC, Si, GaAs, $LiAlO_2$, $LiGaO_2$ or AlN, for example. Next, in a step 1002, an active emitting layer is formed on the first type semiconductor layer. Then, in a step 1004, a second type semiconductor layer is formed on the active emitting layer. In the fourth embodiment of the present invention, it needs to be elected either before the step 1000 or after the step 1004 a step 1006 is implemented. In the step 1006, a saw-toothed multilayer is formed below the substrate by an auto-cloning photonic crystal process. Stacked thin layers in the saw-toothed multilayer are fabricated by using two materials selected from a group consisting of $TiO_2$, $Ta_2O_5$, $Nb_2O_5$, $CeO_2$, ZnS, ZnO, GaN, $SiN_x$, AlN, $Al_2O_3$, $SiO_2$ and $MgF_2$. Since the fourth embodiment does not require additional lithographic and etching processes, process time and fabricating cost thereof are reduced.

In conclusion, the saw-toothed multilayer and/or the lattice structure in the present invention are three-dimensional photonic crystal elements. Through the bandgap of the photonic crystal, the effect of an omnidirectional reflector is achieved so that all the light emitted from the back of the LED entering the saw-toothed multilayer in any incident angle can be omnidirectionally reflected. Meanwhile, the refraction direction of the light is changed by the periodic light grid design such that the light source is vertically focused and radiates forward and thereby enhancing the luminescent efficiency of the LED as a whole.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting diode (LED), at least comprising:
   a substrate;
   a first type semiconductor layer disposed on the substrate;
   an active emitting layer, disposed on the first type semiconductor layer;
   a second type semiconductor layer, disposed on the active emitting layer; and
   a saw-toothed multilayer, disposed below the first type semiconductor layer opposite the active emitting layer, wherein the saw-toothed multilayer is a photonic crystal.

2. The LED as claimed in claim 1, wherein the saw-toothed multilayer is disposed below the substrate.

3. The LED as claimed in claim 1, wherein the saw-toothed multilayer is disposed between the substrate and the first type semiconductor layer.

4. The LED as claimed in claim 3, wherein the saw-toothed multilayer has a lattice structure.

5. The LED as claimed in claim 4, wherein the lattice structure comprises a one-dimensional, two-dimensional or three-dimensional structure.

6. The LED as claimed in claim 4, wherein an arrangement of the lattice structure comprises a triangular, a hexagonal, a square or a combination array.

7. The LED as claimed in claim 4, wherein an outward shape of the lattice structure comprises a rectangle, a strip, a triangle or a half circle.

8. The LED as claimed in claim 4, wherein a period and/or a height of the lattice structure is determined by a luminescent wavelength range thereof suitable for the LED.

9. The LED as claimed in claim 1, wherein the saw-toothed multilayer is periodically and alternately stacked by two or more than two materials with different reflectivities.

10. The LED as claimed in claim 1, wherein a luminescent wavelength of the saw-toothed multilayer suitable for the LED is determined by at least one of a period of the saw-toothed multilayer, a thickness of stacked thin layers in the saw-toothed multilayer, a layer number of the stacked thin layers, and a refractive index of a material of the stacked thin layers.

11. The LED as claimed in claim 1, wherein stacked thin layers in the saw-toothed multilayer are fabricated by using two materials selected from a group consisting of $TiO_2$, $Ta_2O_5$, $Nb_2O_5$, $CeO_2$, ZnS, ZnO, GaN, $SiN_X$, AlN, $Al_2O_3$, $SiO_2$ and $MgF_2$.

12. The LED as claimed in claim 1, wherein a material of the substrate comprises sapphire, SiC, Si, GaAs, $LiAlO_2$, $LiGaO_2$ or AlN.

13. The LED as claimed in claim 1, wherein the saw-toothed multilayer is stacked on the substrate and an initial outward shape of the substrate comprises a triangular cone, a cube, a half circle or a strip with a cross-sectional view as a triangle, a rectangle or a half circle.

14. A process for fabricating an LED, comprising:
   fabricating a saw-toothed multilayer on a substrate by an auto-cloning photonic crystal process to let the saw-toothed multilayer be an auto-cloning photonic crystal;
   patterning the saw-toothed multilayer to form a lattice structure;
   forming a first type semiconductor layer on the substrate to cover the lattice structure;
   forming an active emitting layer on the first type semiconductor layer; and
   forming a second type semiconductor layer on active emitting layer.

15. The process for fabricating the LED as claimed in claim 14, wherein stacked thin layers in the saw-toothed multilayer are fabricated by using two materials selected from a group consisting of $TiO_2$, $Ta_2O_5$, $Nb_2O_5$, $CeO_2$, ZnS, ZnO, GaN, $SiN_X$, AlN, $Al_2O_3$, $SiO_2$ and $MgF_2$.

16. The process for fabricating the LED as claimed in claim 14, wherein a material of the substrate comprises sapphire, SiC, Si, GaAs, $LiAlO_2$, $LiGaO_2$ or AlN.

17. A process for fabricating an LED, comprising:
   a) forming a first type semiconductor layer on a substrate;
   b) forming an active emitting layer on the first type semiconductor layer;
   c) forming a second type semiconductor layer on the active emitting layer; and
   forming a saw-toothed multilayer optionally either before the step a) or after the step c) by an auto-cloning photonic crystal process to let the saw-toothed multilayer be an auto-cloning photonic crystal.

18. The process for fabricating the LED as claimed in claim 17, wherein stacked thin layers in the saw-toothed multilayer are fabricated by using two materials selected from a group consisting of $TiO_2$, $Ta_2O_5$, $Nb_2O_5$, $CeO_2$, ZnS, ZnO, GaN, $SiN_X$, AlN, $Al_2O_3$, $SiO_2$ and $MgF_2$.

19. The process for fabricating the LED as claimed in claim 17, wherein a material of the substrate comprises sapphire, SiC, Si, GaAs, $LiAlO_2$, $LiGaO_2$ or AlN.

* * * * *